United States Patent [19]

Elmasry

[11] 4,445,051
[45] Apr. 24, 1984

[54] FIELD EFFECT CURRENT MODE LOGIC GATE

[75] Inventor: Mohamed I. Elmasry, Waterloo, Canada

[73] Assignee: Burroughs Corporation, Detroit, Mich.

[21] Appl. No.: 277,629

[22] Filed: Jun. 26, 1981

[51] Int. Cl.³ .................... H03K 19/094; H03K 19/20
[52] U.S. Cl. ..................................... 307/450; 307/448
[58] Field of Search ............. 307/448, 450, 453, 468, 307/481, 455, 530, 362, 355; 330/253

[56] References Cited

U.S. PATENT DOCUMENTS

| | | | |
|---|---|---|---|
| 3,501,647 | 3/1970 | Giacomo | 307/455 |
| 3,619,646 | 11/1971 | Vittoz | 307/448 X |
| 3,691,401 | 9/1972 | Forlani et al. | 307/448 |
| 4,074,151 | 2/1978 | Buckley et al. | 307/448 X |
| 4,234,803 | 11/1980 | Nonaka | 307/304 X |
| 4,239,980 | 12/1980 | Takanashi et al. | 307/450 |
| 4,333,020 | 6/1982 | Maeder | 307/453 X |
| 4,365,316 | 12/1982 | Iwahashi et al. | 307/448 X |

FOREIGN PATENT DOCUMENTS

| | | | |
|---|---|---|---|
| 55-163917 | 12/1980 | Japan | 307/450 |
| 56-31211 | 3/1981 | Japan | 330/253 |

Primary Examiner—Larry N. Anagnos
Assistant Examiner—David R. Bertelson
Attorney, Agent, or Firm—Charles J. Fassbender; Kevin R. Peterson

[57] ABSTRACT

Disclosed is a field effect current mode logic gate comprised of a current source for supplying a constant current, and a differential amplifier having first and second branches for passing respective portions of the constant current. The first branch includes a plurality of parallel-coupled or serially-coupled enhancement field effect transistors having a positive threshold voltage and having respective gates for receiving respective input logic signals; and the second branch includes a depletion field effect transistor having a negative threshold voltage, and a grounded gate. The magnitudes of the current portions in the first and second branches are representative of the magnitude of the input logic signals relative to the positive threshold voltage plus the absolute value of the negative threshold voltage.

11 Claims, 9 Drawing Figures

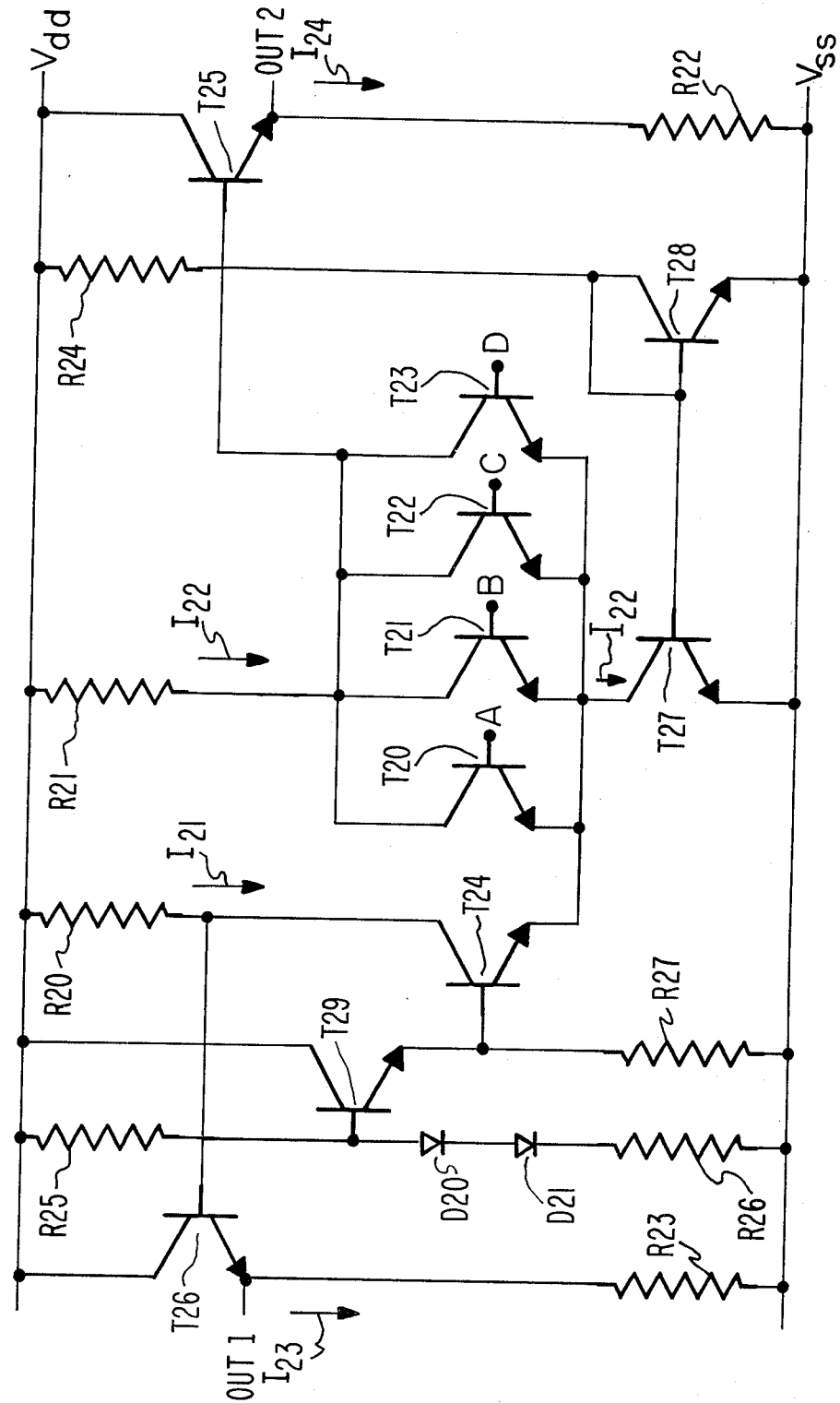
FIG. 4. *Prior Art*

FIELD EFFECT CURRENT MODE LOGIC GATE

BACKGROUND OF THE INVENTION

This invention relates to digital logic gates; and more particularly, it relates to the electronic circuitry from which digital logic gates are constructed.

Since the introduction of field effect transistors in the 1960's, those transistors have played an important role in the fabrication of logic gates. One very important reason for this is that field effect transistors are extremely small in size. (e.g., $-2.5\mu m \times 10\mu m$). Thus; thousands of logic gates can be fabricated on a single semiconductor chip to form large scale integrated circuits.

Today, much research is being performed in order to decrease the field transistors' size even further. However, the circuit configuration for NAND and NOR logic gates has remained essentially unchanged since the 60's. Those circuit configurations are illustrated, for example, in a textbook entitled "Basic Integrated Circuit Engineering", by Douglas J. Hamilton et al, 1975, at page 544.

As there illustrated, a NOR gate consists of a plurality of field effect transistors having their sources and drains coupled in parallel and another field effect transistor coupled between those drains and a power supply voltage $V_{dd}$. The latter transistor has its gate tied to $V_{dd}$ and operates as a resistive load; whereas each transistor of the plurality receives an input logic signal on its gate and the NOR output is generated on its drain.

By comparison, a NAND logic gate consists of a plurality of field effect transistors which are serially coupled to each other and which receive respective input logic signals on their gates. They in turn connect to another field effect transistor which acts as a load resistor, and the NAND logic function is generated at that connection.

These standard field effect transistor logic gates, however, have some serious shortcomings such as a long switching time, a high speed power product, unsymmetrical noise margins, unsymmetrical rise and fall times, and a logic swing which is difficult to adjust relative to the value of the power supply voltage $V_{dd}$.

To improve in some of these areas, such as switching speed, for example, complementary field effect transistor logic gates have been utilized in the prior art. These gates are illustrated at page 546 of the above reference.

However, complementary field effect transistor logic gates suffer from the fact that each logic input to the gate required two complementary transistors instead of just one transistor. Also, since those transistors are complmentary, one of them must be built in a "tub" in the substrate which is doped opposite to the substrate; and thus that transistor is very bulky. Further, the process of fabricating complementary transistors on a substrate is more complex than the process of fabricating field effect transistors of only one conductivity type.

Also in the prior art, logic gates have been fabricated with bipolar transistors in an effort to decrease the gates' switching time. One bipolar NOR gate is illustrated, for example, at page 493 of the above reference. This gate will be discussed herein in greater detail in conjunction with FIGS. 4 and 5.

In general, that bipolar NOR gate operates in a current mode, which means that the relative magnitudes of two currents in respective branches of a differential amplifier in the gate are representative of the logic function which the gate performs. And utilizing that current mode of operation, switching speeds of one nanosecond can be obtained.

One problem, however, with the bipolar current made logic gate is that it occupies too much chip area. This occurs, for example, because a bipolar transistor occupies substantially more chip area than a field effect transistor and because various biasing circuits for the differential amplifier are required in addition to the amplifier itself. Also, to obtain the one nonosecond switching speed, the current in the differential amplifier must be made relatively large which in turn makes the gate's power dissipation and speed power product undesirably high. Further, the fabricating process for bipolar transistors is substantially more complex than the fabricating process for field effect transistors.

Accordingly, it is a primary object of the invention to provide an improved field effect transistor logic gate having nanosecond switching speeds, having a small power dissipation and small speed power product, having nearly equal rise and fall times, and which is simple to fabricate.

BRIEF SUMMARY OF THE INVENTION

This object and others are accomplished in accordance with the invention by a field effect current mode logic gate which is comprised of a field effect current source for supplying a constant current, and a field effect differential amplifier having first and second branches for passing respective portions of that current. The first branch includes a plurality of parallel-coupled or serially-coupled enhancement field effect transistors having a positive threshold voltage and having respective gates for receiving respective input logic signals; and the second branch includes a depletion field effect transistor having a negative threshold voltage and a grounded gate. With this circuit configuration, the magnitudes of the current portions in the first and second branches are representative of the magnitude of the input logic signals relative to the positive threshold voltage plus the absolute value of the negative threshold voltage. No biasing circuitry is required; switching speeds of nearly 1 nanosecond are obtained, and the speed power product per logic output is less than 2 pico joules.

BRIEF DESCRIPTION OF THE DRAWINGS

Various features and advantages of the invention will best be understood by a reference to the following Detailed Description and accompanying drawings wherein:

FIG. 4 is a detailed circuit diagram of a prior art bipolar current mode logic gate for comparison purposes;

DETAILED DESCRIPTION OF THE INVENTION

Figure 1:
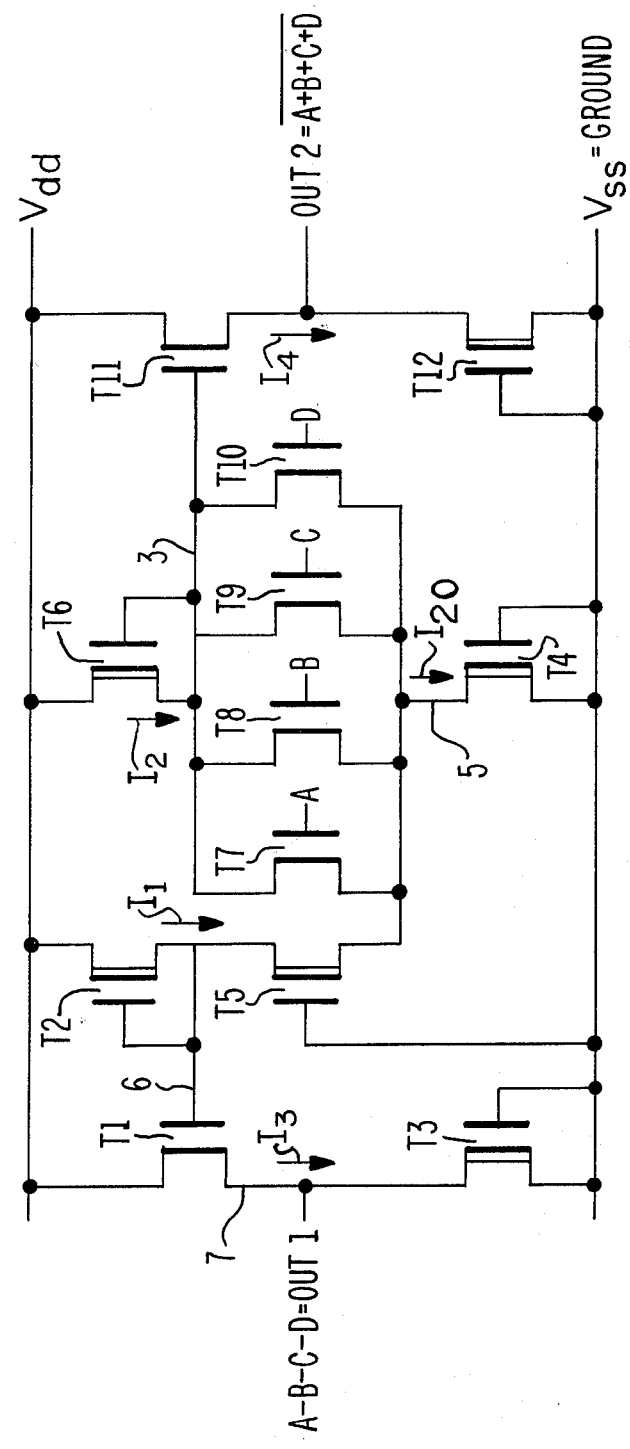
FIG. 1 is a detailed circuit diagram of one preferred embodiment of the invention.
Figure 2:
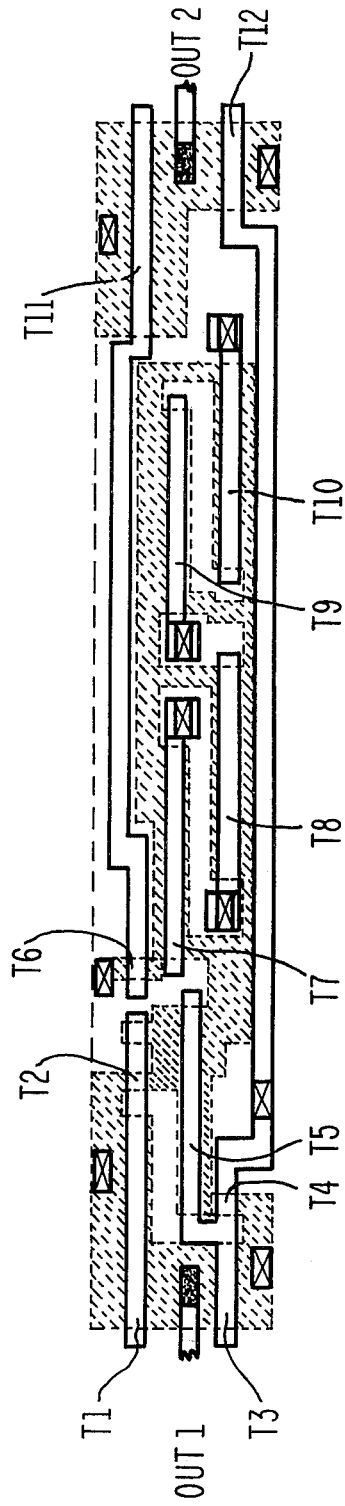
FIG. 2 is a physical layout drawn to scale of the logic gate of FIG. 1.

Referring now to FIGS. 1 through 3, the details of one preferred embodiment of the invention will be described. Beginning first with FIG. 1, there is illustrated a detailed circuit diagram of a logical OR/NOR gate that is constructed according to the invention. This logic gate consists of 12 MOS field effect transistors T1 through T12 which are interconnected as illustrated in that figure.

Transistors T2, T3, T4, T5, T6, and T12 are depletion transistors; whereas the remaining transistors T1, T7, T8, T9, T10, and T11 are enhancement transistors. Also, all of the transistors T1 through T12 are of the same conductivity type. That is, they are all P-channel transistors; or alternatively, they are all N-channel transistors. Preferably, transistors T1 through T12 are integrated on a single semiconductor chip; and many such gates may be fabricated and interconnected on that chip to form a medium scale or large scale integrated logic system.

In the logic gate of FIG. 1, transistors T2, T5, T6, T7, T8, T9, and T10 form a differential amplifier stage. A current $I_1$ flows through one branch of this differential amplifier as formed by transistors T2 and T5; and a current $I_2$ flows through another branch of this differential amplifier as formed by transistors T6 through T10. Currents $I_1$ and $I_2$ are summed by transistor T4. That transistor acts as a current source for the differential amplifier stage; and the summed current $I_0$ is essentially constant in magnitude.

Transistors T7 through T10 are input transistors to the differential amplifier stage. Each of those transistors has a gate for receiving a logic input signal. Those signals are labeled in FIG. 1 as A, B, C, and D. Additional input transistors may be added if more input signals are to be operated on; or alternatively, some of the input transistors may be deleted if fewer input signals are to be operated on.

Transistors T1 and T3 form one source follower output stage; and transistors T11 and T12 form another source follower output stage. Node 7 provides a logical OR function; whereas node 4 provides a logical NOR function. Also, the output stages operate to downshift the voltages on nodes 6 and 3 to levels which correspond to the logic levels of the input signals A and D. Further, the output stages have low output impedance, and thereby provide a means of driving large capacitive loads.

Transistor T5 forms a reference voltage by which the voltage levels of the input signals A through D are compared. That reference voltage equals the magnitude of the threshold voltage of transistor T5 plus the threshold voltage $V|_{T-in}$ of any one of the input transistors T7 through T10. This is stated mathematically as $V_{ref} = V_t|_{T5} + V_t|_{T-in}$.

Presumably, $V_{ref}$ is made equal to the center of the voltage swing of the logic input signals A through D. For example, if the input signals have a logical low voltage of zero volts and a logical high voltage of $V_{dd}$ volts, then $V_{ref}$ preferably is set to equal $V_{dd}/2$.

As a further example, suppose that $V_{dd}$ equals 5 volts. Then suitable threshold voltages for reference transistor T5 and the input transistors T7 through T10 would respectively be $-1.8$ volts and $+0.7$ volts. And to set the threshold voltage $V_t$ of transistors T5 and T7 through T10 at those values, one may utilize the equation $V_t = V_{t0} + \Delta V_t(V_{bb}) - \Delta V_t(V_{ds})$.

In the above equation, $V_{t0}$ is that part of the threshold voltage which is a function of processing parameters and not a function of operating voltages; $\Delta V_t(V_{bb})$ is a shift in threshold voltage due to substrate source voltage bias $V_{bb}$, and it equals zero if $V_{bb}$ equals zero; and $\Delta V_t(V_{ds})$ is a shift in threshold voltage due to drain-source voltage $V_{ds}$, and it equals zero for MOS devices which are properly scaled and have no short channel effects.

Consider now the operation condition where input signal A equals $V_{ref}$ and input signals B, C, and D are all low. Under that condition, current $I_0$ is split equally in the two branches of the differential amplifier stage. That is, current $I_1$ equals current $I_2$.

Suppose next that the logic input signal A rises to become larger than voltage $V_{ref}$. When that occurs, current $I_2$ rises and current $I_1$ drops but the sum of currents $I_2$ and $I_1$ stays essentially constant. Then in response to current $I_2$ rising, the voltage at node 3 drops, which in turn causes the voltage at node 4 to drop.

If the voltage of input signal A rises all the way to a logical one, then current $I_2$ increases to approximately $I_0$; and current $I_1$ decreases to approximately zero. Under that condition, the voltage at node 3 is approximately $V_{dd}$ divided by two; because with transistor T7 turned fully on, voltage $V_{dd}$ is dropped approximately equally between transistors T4 and T6. And in response to that relatively low voltage on node 3, the output voltage on node 4 is lowered to a logical zero level.

Conversely, suppose that logic input signal A drops to some level less than $V_{ref}$. When that occurs, current $I_1$ rises and current $I_2$ drops, while the sum of those two currents remains essentially constant. Then, in response to the drop in current $I_2$, voltage V3 rises. And in response to the rise of voltage V3, output voltage V4 rises.

If input signal A drops all the way to a logical zero level, then current $I_1$ will approximately equal zero. Under that condition, the voltage at node 3 will approximately equal $V_{dd}$. And that relatively high voltage will cause the output voltage on node 4 to rise to a logical one level.

In the above described operation, the voltages at nodes 6 and 7 behave just the opposite of the voltages on nodes 3 and 4 respectively. Thus, voltage transitions that occur on nodes 3 and 4 in response to input signal A rising above reference voltage $V_{ref}$ are the same as the voltage transitions that occur on nodes 6 and 7 when input signal A drops below $V_{ref}$; and vice versa.

Also, in response to variations on input logic signals, the voltage at node 5 varies as follows. When input signal A is at a logical one, then the voltage at node 5 is relatively high and equals the value of that logical one level minus the threshold voltage of transistor T7. Conversely, when input signal A is at a logical zero, the voltage at node 5 is relatively low and equals $V_{ss}$ plus the magnitude of the threshold voltage of reference transistor T5.

The above described logic gate can also be adapted to operate with various fabrication tolerances on $V_t$ and to meet various desired noise margins. To that end, first a nominal reference voltage $V_r$ is selected by choosing a nominal threshold voltage for reference transistor T5 and choosing a nominal threshold voltage for input transistors T2 through T10. From this nominal reference voltage, the tolerance in threshold voltages and the desired noise margin are subtracted to determine the maximum value of the logical zero input voltage level. And to that nominal reference voltage, the threshold voltage tolerance and desired noise margin are added to determine the minimum value of the logical one input voltage level.

Suppose, for example, that the nominal threshold voltage of transistors T7 through T10 is 0.7 volts and the nominal threshold voltage of transistor T5 is −1.8 volts. Then the nominal reference voltage would be 2.5 volts. Suppose further that the threshold tolerance is ±500 millivolts, and the desired noise margin is 500 millivolts. Then the maximum logical zero voltage level would be 1.5 volts, and the minimum logical one voltage level would be 3.5 volts.

Next, with reference to FIG. 2, one preferred physical layout for the circuit of FIG. 1 will be described. This layout is drawn to scale, and the scaling factor is 1,265 times the actual size. In arriving at this layout, state of the art design rules for mass produced MOS circuits were used.

That is, the rules used were conservative and do not reflect improvements that could be obtained in a laboratory environment. These rules included: (1) a minimum gate length of 2.5 $\mu$m; (2) a minimum line width of 2.5 $\mu$m; (3) a minimum line spacing of 2.5 $\mu$m; (4) a minimum contact hole of 2.5 $\mu$m × 4.0 $\mu$m; and (5) a minimum overlap of 1 $\mu$m between a metal or polycrystalline silicon line and a contact hole. Utilizing these rules, the total required chip area was found to be 25 $\mu$m × 145 $\mu$m or 3,625 $\mu$m$^2$, as can be measured directly from FIG. 2 with the aid of the above scaling factor.

In FIG. 2, crosshatched lines indicate diffused or implanted regions in the semiconductor substrate. These regions form the source and drain for the transistors as well as some of the interconnections between the same. Solid lines in FIG. 2 represent polysilicon. That polysilicon forms the transistors' gates, and some of the interconnections between the same. Each transistor in FIG. 2 is labeled on its polysilicon gate.

Also in FIG. 2, each rectangle with an enclosed X indicates a connection to a metal line; whereas each solid rectangle indicates a connection to a polysilicon line. For simplicity, the metal lines are not shown; but they can be easily visualized, since they are merely straight horizontal lines.

Metal lines from transistors T7 and T8 run from their respective contact points to the lefthand side of FIG. 2; metal lines from transistors T9 and T10 run from their respective contact points to the righthand side of FIG. 2; one metal line carrying voltage $V_{dd}$ runs across the top of FIG. 2 and has three contact points; and another metal line carrying voltage $V_{ss}$ runs across the bottom of FIG. 2 and has three contact points.

Also in FIG. 2, the width/length ratios of transistors T1 through T11 are chosen such that the total gate switches in about one nanosecond, and has a speed power product per output of less than 2 pico joules. To that end, transistors T1, T5, T7, T8, T9, T10, and T11 each have a W/L ratio of 25/2.5; transistors T3 and T12 each have a W/L ratio of 10/2.5; and transistors T2, T4, and T6 each have a W/L ratio of 2.5/2.5.

These particular W/L ratios are chosen by noting that the switching time $T_D$ of the gate is inversely proportional to the magnitude of currents $I_0$, $I_3$, and $I_4$. Each of these currents, in turn, is proportional to $\mu/t_{ox} \times (W/L) \times (V_{gs} - V_t)^2$. Thus, a large W/L ratio yields a small switching delay.

However, a large W/L ratio also yields a large current which in turn increases the gates' power dissipation. In other words, as switching speed decreases, power increases. Thus, the speed power product remains essentially constant for the gate and is a figure of merit. The smaller the speed power product, the more attractive the circuit is.

Utilizing a circuit analysis program, the operation of the logic gate of FIGS. 1 and 2 was simulated on a digital computer. The particular program that performed the simulation is called "SPICE 2" ; and it is available to the public. This program is described in a publication by E. Cohen entitled "Program Reference for SPICE 2", ERL Memo N. ERL-M592, Electronics Research Laboratory, University of California, Berkeley, June, 1976.

Figure 3A:
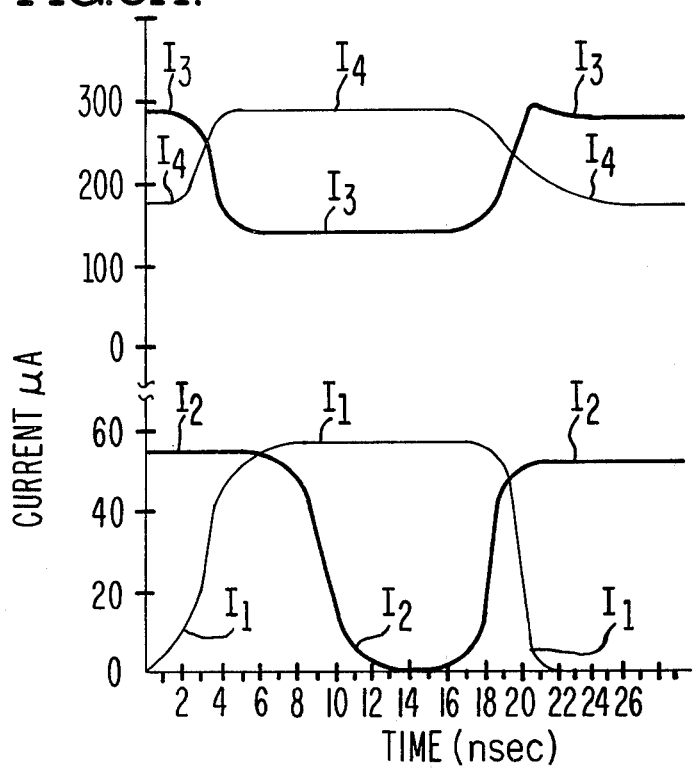
FIGS. 3A and 3B are a set of curves illustrating the operation of the gate of FIG. 1.
Figure 3B:
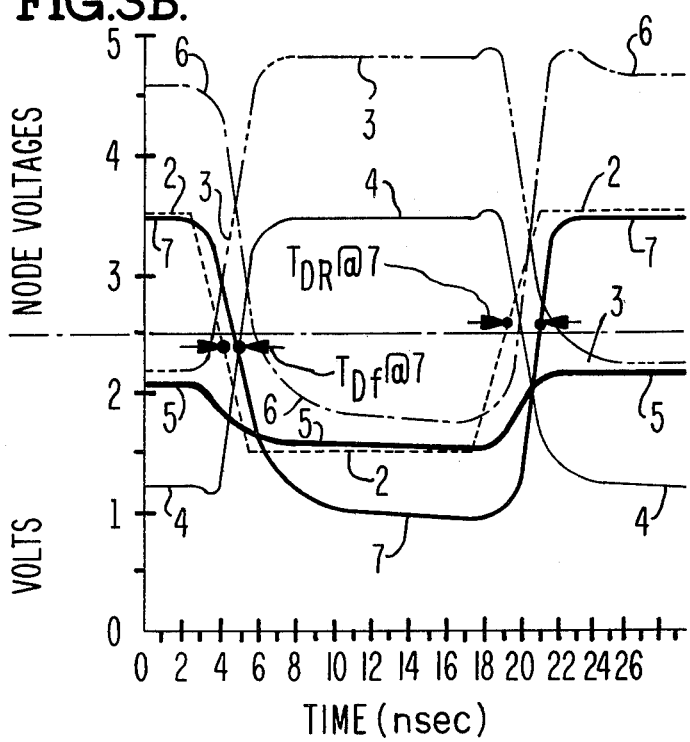

Circuit parameters utilized in this simulation were: all the above stated W/L ratios; $V_t$ for the enhancement transistors of 0.7 volts; $V_t$ for the depletion transistors of −1.8 volts; $V_{dd}$ of 5.0 volts; $V_{ss}$ of 0 volts; and $T_{ox}$ of 300 Å. Utilizing these parameters, the SPICE 2 program generated the graphs of FIGS. 3A and 3B. FIG. 3A illustrates the variation of currents $I_1$–$I_4$ as a function of time; and FIG. 3B illustrates the variation of the voltages on nodes 2–7 as a function of time. All of these signals vary in response to input logic signal A on node 2.

From these curves, the speed and speed power product of the FIG. 1 and 2 circuit can be obtained. First with reference to FIG. 3B, the fall time $T_{df}$ of node 7 is labeled; and the rise time $T_{dr}$ of node 7 is also labeled. By inspection, $T_{df}$ can be seen to equal 0.6 nanoseconds; and $T_{dr}$ can be seen to equal 1.8 nanoseconds. Thus, the average time delay from input to output is 1.2 nanoseconds.

Next, inspection of the curves $I_1$ and $I_2$ in FIG. 3A shows that the average current $I_0$ through the differential amplifier stage is 55 microamps. This is evident by recalling that current $I_0$ is the sum of currents $I_1$ and $I_2$. And FIG. 3A shows that currents $I_1$ and $I_2$ respectively are 55 microamps and 0; or vice versa.

Thus, the power consumed by the differential amplifier stage equals 55 microamps times $V_{dd}$, which equals 275 microwatts. That power times the switching speed of the differential amplifier is its speed power product. Inspection of FIG. 3B shows that the differential stage switches before the output stages; and its switching speed can be approximated to be one-half the switching speed of the total circuit, or 0.6 nanoseconds. Thus, the speed power product of the differential stage equals only 0.02 pico joules.

Again, using the curves of FIG. 3A, the speed power product per output stage can be calculated. In FIG. 3A, the $I_3$ and $I_4$ curves show that on the average, currents $I_3$ and $I_4$ both equal 250 microamps. Thus, the power consumed in both output stages is 500 microamps times $V_{dd}$ or 2,500 microwatts. Also as determined above, these output stages switch on an average of 1.2 nanoseconds. So the speed power product for both output stages equals 2,500 microwatts times 1.2 nanoseconds which equals 3 pico joules. Therefore, the speed power product for the entire FIG. 1 circuit equals 3 pico joules plus 0.02 pico joules or 1.5 pico joules per logic output.

Consider now how the above described field effect transistor logic gate of FIGS. 1 and 2 compares to the prior art bipolar current mode logic gate of FIG. 4. That FIG. 4 gate consists of bipolar transistors T20 through T29, resistors R20 through R27, and diodes D20 and D21. All of those components are interconnected as illustrated.

In the FIG. 4 circuit, transistors T20–T24 and resistors R20 and R21 form a differential amplifier. Transistor T27 forms a current source for that differential amplifier. Transistor T25 and resistor T22 form an output stage which generates a logical NOR function; and transistor T26 and resistor R23 form another output stage which generates a logical OR function.

This differential amplifier, current source, and output stages operate similar to their counterparts in the FIG. 1 circuit. In particular, logic input signals A–D are applied to the respective bases of transistors T20–T23. And the magnitude of those logic signals relative to the reference voltage on the base of transistor T24 determines which of two currents $I_{21}$ or $I_{22}$ in the differential amplifier is the larger current.

Currents $I_{21}$ and $I_{22}$ are summed by transistor T27 as current $I_{20}$ which is essentially constant. And the relative magnitude of currents $I_{21}$ and $I_{22}$ are sensed by transistors T25 and T26 in the output stages, which in turn generate output signals that are compatible with logic levels of the input logic signals A–D.

In addition, however, the FIG. 4 logic gate includes a bias circuit for current source T27. That bias circuit consists of transistor T28 and resistor R24. Further, the logic gate of FIG. 4 includes a bias circuit for transistor T24. And that bias circuit consists of transistor T29, diodes D20 and D21, and resistors R25–R27.

These additional bias circuits are required because the bipolar transistors T24 and T27 cannot be constructed to operate without them. By comparison, in the field effect transistor logic gate of FIG. 1, the corresponding transistors T4 and T5 were formed such that they were self-biasing. This is important because the bias circuits of FIG. 4 add to the chip space that is required to fabricate the logic gate.

However, to reduce that chip space, the bias circuits can be shared among about five other logic gates. Thus, the total chip space that is required for the FIG. 4 logic gate can be expressed mathematically as $8T+4R+(1/5)(2T+4R+2D)$. In this expression, the symbols T, R, and D respectively stand for the space required by one bipolar transistor, the space required by one resistor and the space required by one diode.

Figure 5B:
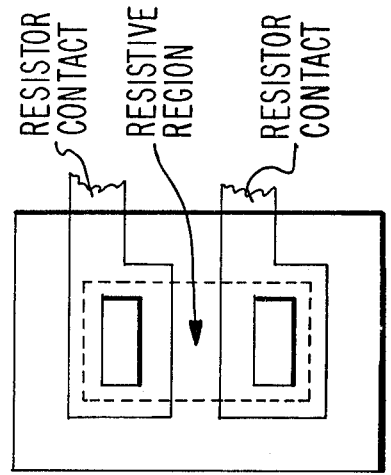
FIGS. 5A and 5B are physical layouts drawn to scale of the transistors and resistors in the circuit of FIG. 4.
Figure 5A:
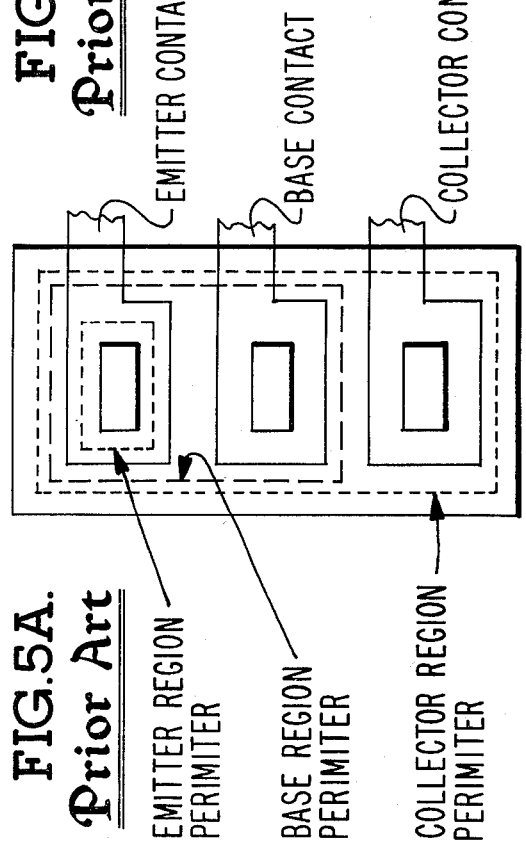

To further evaluate this mathematical expression, FIGS. 5A and 5B are provided herewith. FIG. 5A shows the physical layout for one bipolar transistor; and FIG. 5B shows the physical layout for one resistor. These physical layouts are drawn to scale at a scaling factor of 1,265 times the actual size. That is the same scaling factor which was used in generating FIG. 2.

Also, FIGS. 5A and 5B were generated using state of the art layout rules for mass produced bipolar transistors. These rules include: (1) a minimun line width of 4 $\mu$m; (2) a minimum line spacing of 4 $\mu$m; (3) a minimum contact area of 4 $\mu$m×6 $\mu$m; (4) a minimum metal overlap with a contact area of 2 $\mu$m; (5) a minimum field oxide width of 6 $\mu$m around the transistor to isolate it from another.

Utilizing the above scaling factor, the bipolar transistor's size can be measured directly from FIG. 5A to be 16 $\mu$m×32 $\mu$m or 512 $\mu$m². Note that this is a very optimistic number because commercially available state of the art bipolar transistors actually occupy approximately 1,000 $\mu$m² of chip space. Also by direct measurement of FIG. 5B, the chip space occupied by one resistor can be seen to be 16 $\mu$m×26 $\mu$m or 412 $\mu$m². Again, this is an optimistic number because it was obtained by utilizing minimum dimensions. So any resistor having a large resistance will need to be longer, and any resistor having a smaller resistance will need to be wider.

To evaluate the above expression for chip space for the FIG. 4 circuit, all that is now needed is the chip space per diode. In a bipolar circuit, a diode usually is formed by fabricating a transistor and interconnecting the base to the collector. But for our comparison purposes, assume that the diodes occupy only the space of FIG. 5B because that is less than the space occupied by a transistor. Then utilizing the values of 512 $\mu$m² per transistor and 416 $\mu$m² per resistor and per diode, the total chip space occupied by the FIG. 4 circuit can be calculated to be 6,463 $\mu$m².

This chip space is approximately two times the chip space occupied by the FIG. 1 logic gate. Further, in actual practice, the chip space occupied by the FIG. 4 circuit will be substantially greater than two times the chip space occupied by the FIG. 1 circuit because of the optimistic assumptions that were stated above. Also, the above calculations included no allowances for interconnecting the various transistors, resistors, and diodes. Further, the biasing circuits in the FIG. 4 circuit are very simple. In addition, the factor of two will increase as inputs are added to the logic gate.

Compare now the speed power products of the FIG. 4 logic gate with that of the FIG. 1 logic gate. To begin, the switching speed of the FIG. 4 logic gate can be taken to be one nanosecond. That switching speed represents the state of the art of commercially available bipolar current mode logic gates.

Also, to obtain that one nanosecond switching speed, each of the currents through output stage T25, output stage T26, and current source T27 must equal approximately 0.5 milliamps. This is because the switching speed of a bipolar transistor varies with the current gain $\beta$ of that transistor; and $\beta$ varies approximately parabolically with its collector current and reaches a maximum when collector current is 0.5 milliamps plus or minus 10%.

Based on the above, the power consumed in the FIG. 4 circuit can be calculated to be 1.5 milliamps times $V_{dd}$ or 7.5 microwatts. In this calculation, the 1.5 milliamps is the total current passing through transistors T25, T26, and T27. Next, the speed power product for the entire logic gate of FIG. 4 can be calculated to be 7.5 milliwatts times one nanosecond, or 3.7 pico joules per logic output. By comparison, the speed power product for the FIG. 1 logic circuit was only 1.5 pico joules per logic output.

One preferred embodiment of the invention has now been described in detail. In addition, however, various changes and modifications can be made to those details without departing from the nature and spirit of the invention. For example, FIGS. 6 and 7 illustrate two such modifications.

Figure 6:
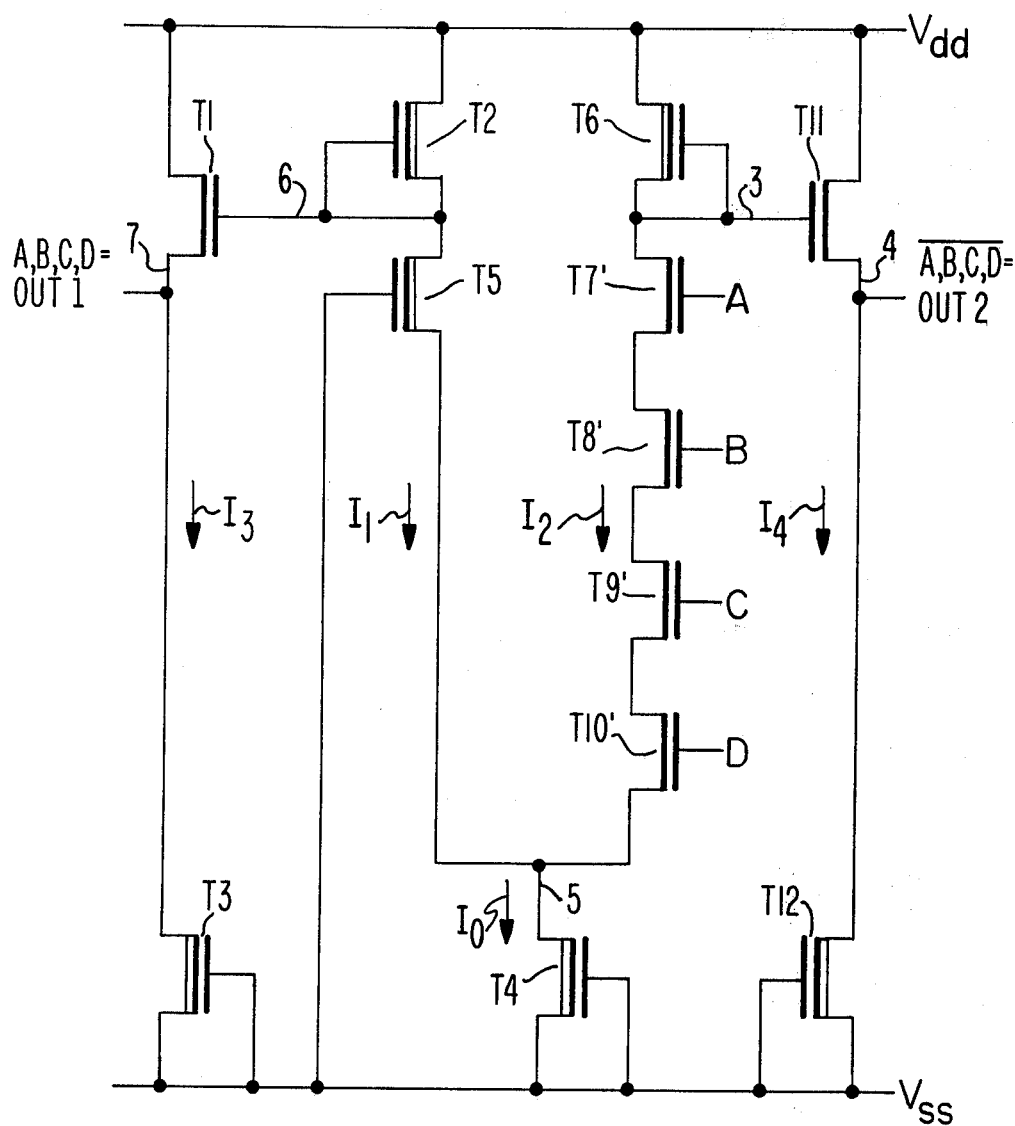
FIG. 6 is a detailed circuit diagram of another preferred embodiment of the invention.

In the FIG. 6 embodiment, those field effect transistors which receive input logic signals A–D are connected in series; whereas by comparison, corresponding field effect transistors in the FIG. 1 embodiment are connected in parallel. To note this distinction, input transistors are labeled T7'–T10' in FIG. 6 whereas they are labeled T7–T10 in FIG. 1. All other components and interconnections in the FIG. 6 circuit are identical to the FIG. 1 circuit, and they are labeled accordingly.

In operation, the FIG. 6 circuit generates a logical NAND function on node 4 and a logical AND function on node 7. These functions are generated because when all of the input logic signals A–D are higher than the previously defined reference voltage $V_{ref}$, then current $I_2$ is larger than current $I_1$. Thus, node 3 drops to a relatively low potential which turns off transistor T11 and lowers the voltage at node 4. Conversely, when any one of the logic input signals A–D is lower than reference voltage $V_{ref}$, current $I_2$ is less than current $I_1$. Thus, the voltage at node 3 rises which causes transistor T11 to turn on and raise the output voltage at node 4. Also, as previously described, voltages on nodes 6 and 7 behave just the opposite to the voltages on nodes 3 and 4 respectively.

Figure 7:
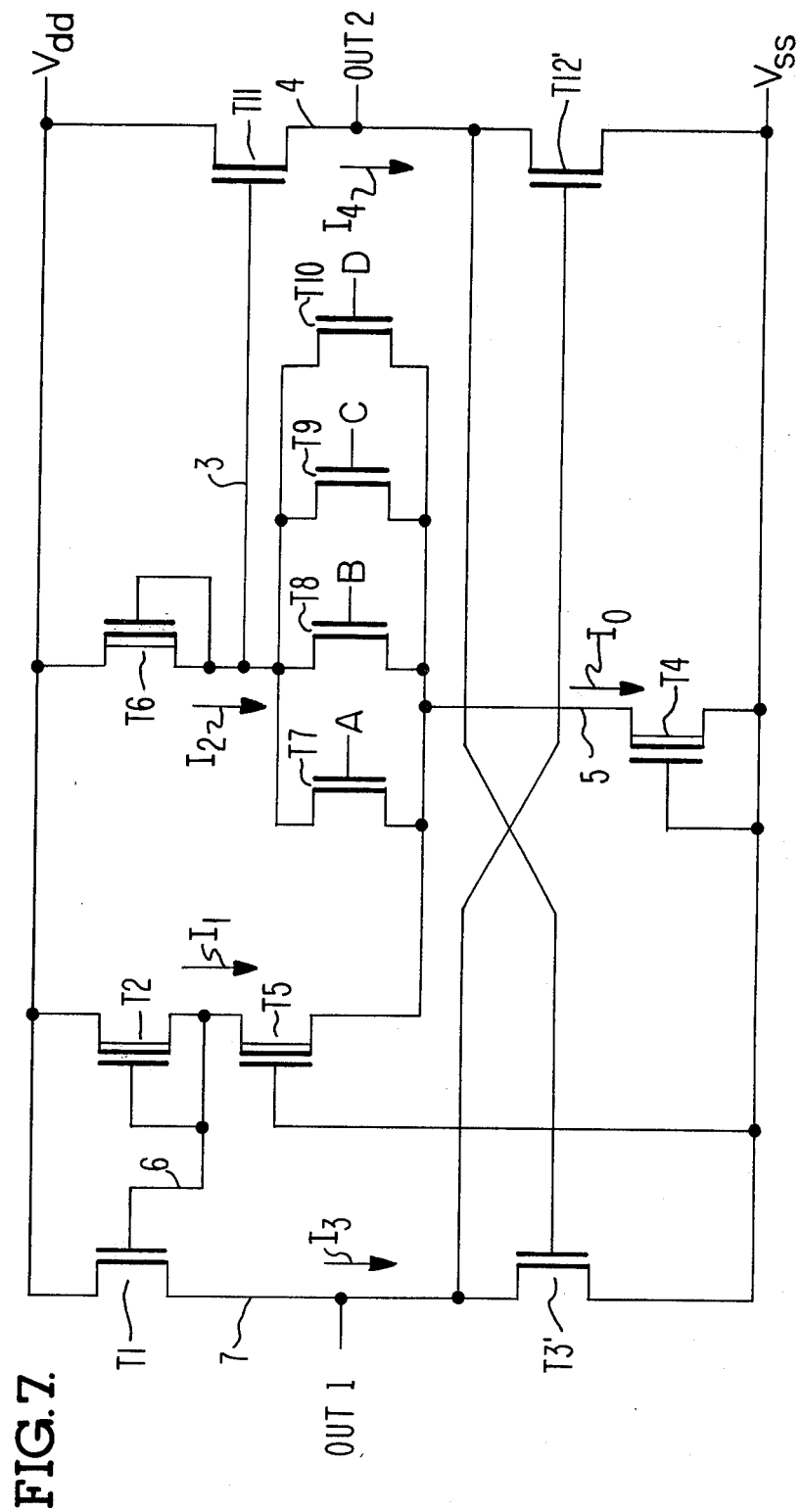
FIG. 7 is a detailed circuit diagram of still another preferred embodiment of the invention.

Turning now to the embodiment of FIG. 7, all of the components and interconnections there illustrated are identical to those of FIG. 1 with the exception being two transistors in the output stages have their gates cross-coupled to each other. Those transistors are labeled T3 and T12 in FIG. 1; whereas they are labeled T3' and T12' in FIG. 7 to indicate the cross-coupling. All other corresponding components in FIGS. 1 and 7 have identical reference numerals.

In operation, the FIG. 7 circuit generates logical NOR and logical OR output signals on nodes 4 and 7 respectively just as does the embodiment of FIG. 1. However, the power consumption in the FIG. 7 circuit is approximately half of that in the FIG. 1 circuit due to the cross-coupling between transistors T3' and T12'. This is because when the output voltage on node 4 is high, that high voltage increases the conductivity of transistor T3' which in turn lowers the gate voltage on transistor T12' and turns it off. Thus, current $I_4$ is reduced essentially to zero. Conversely, when the output voltage on node 7 is high, that high voltage increases the conductivity of transistor T12' which in turn lowers the gate voltage of transistor T3' and turns it off.

As another modification, the cross-coupling of the FIG. 7 circuit may be incorporated into the FIG. 6 circuit. That is, the gates of transistors T3 and T12 in FIG. 6 may be cross-coupled to each other to thereby reduce the power consumption and speed power product of that circuit. Further, as still another modification, transistor T4 in the circuits of FIGS. 1, 6, and 7 can be made an enhancement transistor and have its gate clocked by a control signal. In that case, the constant current $I_0$ would be turned on and off in response to the control signal to further reduce power consumption.

Accordingly, since many such modifications can be made to the above described preferred embodiments of my invention, it is to be understood that said invention is not limited to said details but is defined by the appended claims.

What is claimed is:

1. A field effect current mode logic gate comprised of:
   a field effect current source means for supplying a constant current;
   a field effect differential amplifier means having first and second branches coupled between said current source means and a power source means for passing respective portions of said constant current;
   said first branch including a plurality of parallel coupled enhancement field effect transistors having a positive threshold voltage and having respective gates for receiving respective input logic signals; and
   said second branch including a depletion field effect transistor having a negative threshold voltage and a grounded gate, whereby the magnitudes of said current portions in said first and second branches are representative of the magnitude of said input logic signals relative to said positive threshold voltage plus the absolute value of said negative threshold voltage.

2. A field effect current mode logic gate comprised of:
   a field effect current source means for supplying a constant current;
   a field effect differential amplifier means having first and second branches coupled between said current source means and a power source means for passing respective portions of said constant current;
   said first branch including a plurality of serially coupled enhancement field effect transistors having a positive threshold voltage and having respective gates for receiving respective input logic signals; and
   said second branch including a depletion field effect transistor having a negative threshold voltage and a grounded gate, whereby the magnitudes of said current portions in said first and second branches are representative of the magnitude of said input logic signals relative to said positive threshold voltage plus the absolute value of said negative threshold voltage.

3. A field effect current mode logic gate according to claims 1 or 2 wherein said field effect transistors are metal-oxide-silicon field effect transistors.

4. A field effect current mode logic gate according to claims 1 or 2 wherein said field effect transistors are N-channel field effect transistors.

5. A field effect current mode logic gate according to claims 1 and 2 wherein said field effect transistors are P-channel field effect transistors.

6. A field effect current mode logic gate according to claims 1 and 2 wherein said plurality of enhancement field effect transistors and said depletion field effect transistor together have a speed power product of less than one pico joule.

7. A field effect current mode logic gate according to claims 1 or 2 wherein each enhancement field effect transistor of said plurality has a width/length ratio of at least 25/2.5.

8. A field effect current mode logic gate according to claims 1 and 2 wherein said current source is another depletion field effect transistor having a gate coupled to its source and to said gate of said previously recited depletion field effect transistor.

9. A field effect current mode logic gate according to claims 1 or 2 wherein said current source is another enhancement field effect transistor having a gate for receiving a control signal which initiates said constant current.

10. A field effect current mode logic gate according to claims 1 or 2 and further including an output means for generating output logic signals indicating which of said branches are passing the larger portion of said constant current and having a speed power product of less than two pico joules.

11. A field effect current mode logic gate according to claims 1 or 2 and further including a pair of output means for generating respective output logic signals indicating which of said branches is passing the larger portion of said constant current, with each output means of said pair including a field effect transistor, and with said field effect transistors in said pair of output means having cross-coupled gates.

* * * * *